United States Patent [19]

Olsson et al.

[11] Patent Number: 5,000,691
[45] Date of Patent: Mar. 19, 1991

[54] PIN FASTENED TO A PRINTED CIRCUIT BOARD BY SOLDERING

[75] Inventors: Rolf T. Olsson, Tullinge; Björn T. Kassman, Haninge; Karl-Gustaf Olsson, Stockholm; Stig C. Ernolf, Sollentuna, all of Sweden

[73] Assignee: Telefonaktiebolaget L M Ericsson, Stockholm, Sweden

[21] Appl. No.: 492,326

[22] Filed: Mar. 12, 1990

Related U.S. Application Data

[63] Continuation of Ser. No. 305,733, filed as PCT SE, 88/00253 on May 18, 1988, published as WO88/10015 on Dec. 15, 1988, abandoned.

[30] Foreign Application Priority Data

Jun. 11, 1987 [SE] Sweden .................................. 8702441

[51] Int. Cl.$^5$ .............................................. H01R 9/09
[52] U.S. Cl. ...................................... 439/83; 439/876; 439/886
[58] Field of Search ................................. 439/80–83, 439/876, 886

[56] References Cited

U.S. PATENT DOCUMENTS

| | | | |
|---|---|---|---|
| 3,268,653 | 8/1966 | McNutt | 439/83 |
| 3,428,934 | 2/1969 | Reider, Jr. | 339/17 |
| 4,236,776 | 12/1980 | Wellington | 439/83 |
| 4,421,368 | 12/1983 | Saban | 339/17 CF |
| 4,577,923 | 3/1986 | Ikemizu | 439/83 |
| 4,723,925 | 2/1988 | Orr, Jr. et al. | 439/83 |

FOREIGN PATENT DOCUMENTS 3414343 10/1985 Fed. Rep. of Germany .

Primary Examiner—Paula A. Bradley
Attorney, Agent, or Firm—Burns, Doane, Swecker & Mathis

[57] ABSTRACT

The invention relates to a pin (21) for connecting an electrical conductor (2) to a PCB (4). The pin has a first part (24) thrust into a hole in the PCB and a second part (26), to which the electrical conductor (2) is connected by a sliding contact (8). The cross-sectional dimension (d2) of the second part (26) is greater than the cross-sectional dimension (d1) of the first part (24), and between these parts the pin (21) has a shoulder (27) with sharp edges. The hole in the circuit board is coated with a metal which is connected via tabs (22) to electrical conductors (3) of the PCB(4). The pin (21) is soldered in the hole with the aid of soldering metal (25) and flux. When the flux is heated it creeps along the surface of the pin. During soldering, the shoulder (27) with the edges prevents the flux reaching the second part (26) of the pin (21), the second part having contact surfaces (29) on the pin (21) against the sliding contact (8) and where the flux would be a contact resistance. The pin (21) has the advantage that its first part (24) is narrow and that the tabs (22) can have a small outside diameter. There is thus created room for a large number of conductors (3) between two adjacent pins (21).

5 Claims, 4 Drawing Sheets

PIN FASTENED TO A PRINTED CIRCUIT BOARD BY SOLDERING

This application is a continuation of application Ser. No. 07/305,733, filed as PCT SE88/00253 on May 18, 1988, published as WO88/10015 on Dec. 15, 1988, now abandoned.

TECHNICAL FIELD

The invention relates to a pin attached to a printed circuit board (PCB) by soldering for connecting electrical conductors to the PCB, the pin having a first part soldered to a metal coating on the PCB, and a second part with which said electrical conductors can make contact, and where flux is used in soldering the pin, the flux wetting the surface of the pin and creeping away from the soldering location.

BACKGROUND ART

Pins are used in many applications for connecting electrical conductors to PCBs, the pins being soldered to the PCB. In soldering, a flux is used, which wets the pin and creeps along its surface. In such cases it is a known problem that during soldering the flux can creep to the upper part of the pin where there are the connected electrical conductors. The flux can there act chemically on an integrated circuit which is connected via the pin, for example, or constitute a contact resistance between the pin and a gliding contact thrust on to it. In order to prevent the flux from creeping along the pin it has been proposed to provide a tight closure round the pin, e.g. as described in the German patent application DE 3414343. In this publication there is described an insulating casing with pins for electrical connection, these pins being fixed in holes in the walls of the casing. Each pin has a transverse protuberance which is pressed into a corresponding hole in the casing. However, it has been found difficult to achieve a completely tight closure in this way, and it has been proposed to further seal the closure with the aid of glue or lacquer. A completely sealed closure has not been able to be provided with the aid of these sealing means either, and the flux has crept past the closure by capillary action.

DISCLOSURE OF INVENTION

The problem described has been solved in accordance with the invention by a pin which is formed such that is counteracts the creep of the flux along the surface of the pin to the place of contact for the electrical conductors. The invention has the distinguishing features disclosed in the accompanying claims.

BRIEF DESCRIPTION OF DRAWINGS

An embodiment example of the present invention will now be described in more detail in connection with a drawing where.

BEST MODE FOR CARRYING OUT THE INVENTION

Figure 1:
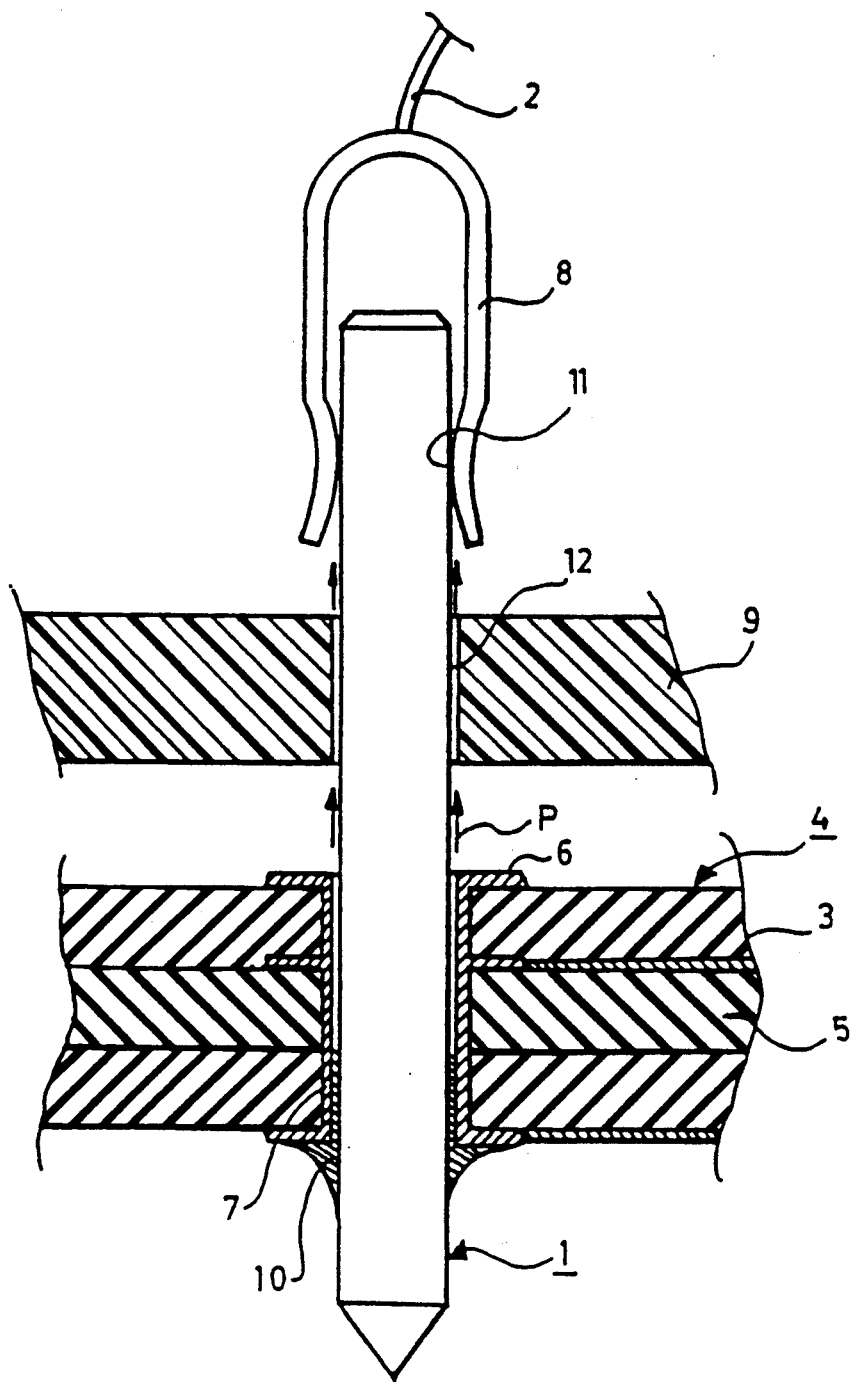
FIG. 1 is a cross section illustrating a PCB and a pin of known embodiment.

In FIG. 1 there is illustrated a known pin 1, by which an electrical conductor 2 is connected to electrical conductors 3 in a PCB 4. The latter is conventionally built up of insulating material layers 5 on which the conductors 3 are situated. The conductors 3 of the different layers 5 are connected to metal tabs 6 connected to each other via a metal tube 7 through the circuit board. This tube is achieved by a hole being drilled in the PCB 4 through the metal tabs 6, whereafter the inside of the hole is coated with metal. The electrical conductor 2 is connected to the pin 1 with the aid of a sliding contact 8, engaging against the pin 1 with the aid of spring bias. The pin 1 is retained in a older 9 of plastic material, which also retains a plurality of unillustrated pins connected to the circuit board 4. The pin 1 is thrust into the tube 7, and to obtain good electrical and mechanical connection between the pin 1 and the tube 7 the pin is soldered in the tube by soldering metal 10. For soldering, the pin 1 is inserted in the tube, subsequent to which the inside of the tube 7 and the pin 1 are coated with flux, then the underside of the PCB 4 is lowered into a bath of molten soldering metal. During soldering the flux is heated and is forced away by the soldering metal 10 to creep along the surface of the pin 1 as indicated by arrows P in the figure. At the place of attachment of the pin in the holder 9, there are narrow gaps 12 between the pin 1 and the holder 9 through which the flux can creep. The flux can thus reach the surface 11, against which the gliding contact 8 is to engage, and cause contact resistance between the pin 1 and the contact 8. It has been found very difficult to form the holder 9 such that a completely sealed connection between the pin and holder is obtained, which would prevent the flux reaching the upper part of the pin.

Figure 2:
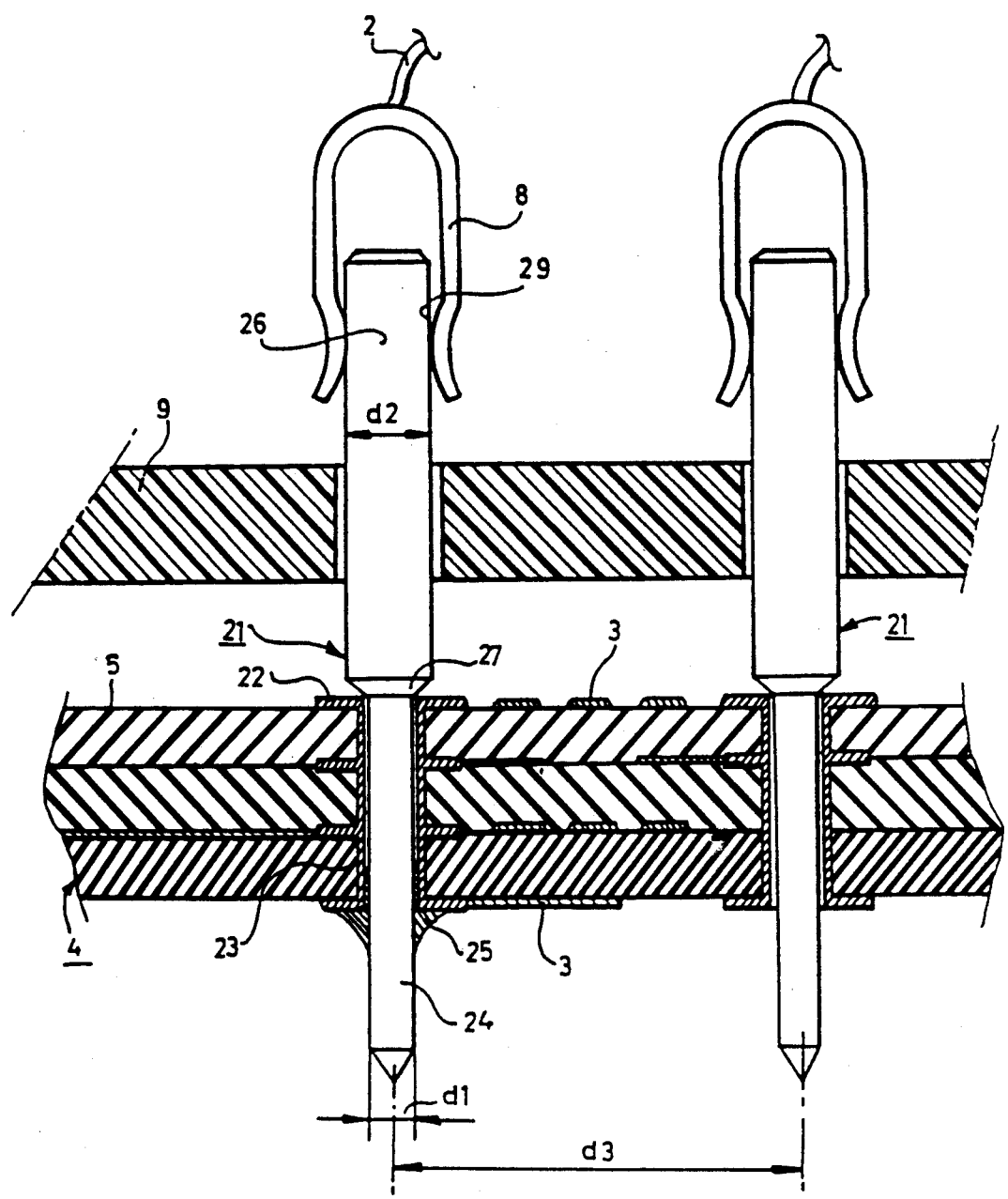
FIG. 2 in cross section illustrates the PCB with the inventive pin, FIG. 3 in cross section illustrates a detail of the inventive pin.

The PCB 4 with pin 21 in accordance with the invention are illustrated in FIG. 2, and are formed such that they counteract the movement of the flux along the pin. The electrical conductors 2 are connected to the conductors 3 in the circuit board 4 via the pin 21, which is retained by the holder 9. As described in connection with FIG. 1, the conductors 3 of the PCB are connected to metal tabs 22, which are mutually connected right through the PCB 4 by metal tube 23. The pin 21 has a first elongate, uniformly thick part 24 which is thrust into the metal tube 23 and attached to it via soldering metal 25. The electrical conductors 2 are connected by gliding contacts 8, engaging against surfaces 29 of a second elongate, uniformly thick part 26 of the pin 21. The cross-sectional dimension d2 of the second part 26 is greater than the cross-sectional dimension d1 of the first part 24. At the middle portion of the pin 21 the second part 26 projects out past the first part 24 round the entire periphery of the pin 21 so that a shoulder 27 is formed. The relationship between the cross-sectional dimensions d1 and d2 is less than 3:4 and the shoulder 27 has an extension in the longitudinal direction of the pin which is less than the difference between the cross-sectional dimensions. At the junctions between the shoulder 27 and the parts 24, 26 of the pin the latter has sharp edges 30 which prevent the flux creeping, as will be explained below.

Figure 3:
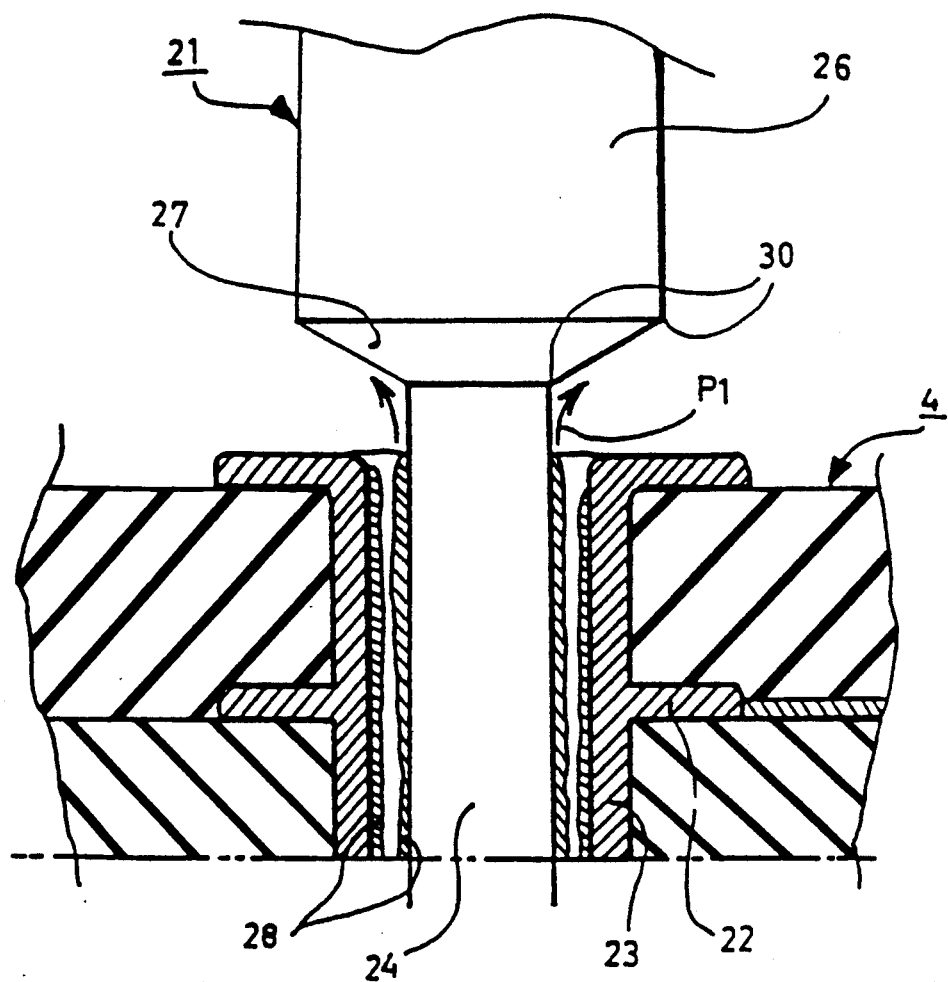

A fragmentary section of the inventive pin 21 and PCB 4 is illustrated in FIG. 3. The inside of the tube 23 and the first part 24 of the pin are coated with flux 28, which wets the surface of the first part 24 during soldering and creeps upwards as illustrated by the arrows p1. It has been found by trials that the creep of the flux is made more difficult by the edges 30 of the shoulder 27. During soldering there is a collection of flux at the lower one of the edges. When the amount of flux connected has reached a certain size the flux begins to creep along the surface of the shoulder 27 and a new collection of flux is formed at the upper one of the edges. The build-up of these collections of flux takes such a long time that there is time for soldering to be terminated and the temperature of the pin 21 to fall, so that the flux has time to solidify. The shoulder thus counteracts the creep of flux up around the second part 26 of the pin to the engaging surfaces 29 for the gliding contact 8. In the embodiment the shoulder 27 is situated spaced from the uppermost metal tab 22 and has no sealing function in co-action with it. By the shoulder being situated with this spacing from the tab, heat conduction during soldering is delayed to the upper part 26 of the pin 21, and cooling the pin is facilitated. This contributes to the solidification of the flux 28 and prevention of the flux from creeping to the contact surfaces 29.

Figure 4:
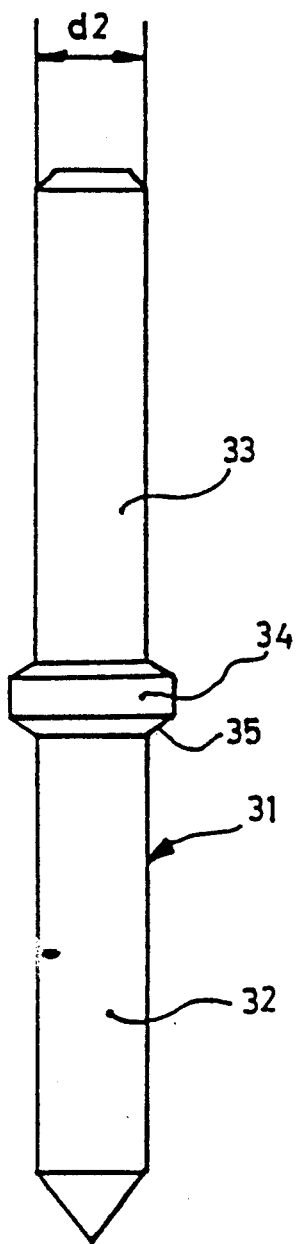
FIG. 4 is a side view of a further embodiment of a pin in accordance with the invention.

An alternative embodiment of the pin 21 described above is illustrated in FIG. 4. A pin 31 has a first elongate, uniformly thick part 32 and a second elongate part 33 with a protuberance 34 extending round the entire periphery of the pin 31. The first part 32 is intended for thrusting into, and soldering to the hole in the PCB 4. The protuberance 34 forms a shoulder 35, which counteracts that the flux heated during soldering can creep up along the second part 33 of the pin 31, as described in connection with FIG. 3.

The inventive pins 21 and 31 described above can be formed so that they fit in with German DIN standards, in which the respective second parts 26 and 33 of the pins have a rectangular cross section with the dimension d2=0.6 mm, for being connected to standardized gliding contacts 8. The spacing d3 between the pins is also standardized. According to an advantageous embodiment of the invention, the first, narrow part of the pin 21 in FIGS. 2 and 3 is rectangular, with the cross sectional dimension d1=0.3 mm, and with the second part 26 projecting outside the first part 24 along the entire periphery of the pin. Apart from the properties described above, this embodiment has the advantage that the diameter of the tab 22 is less than the diameter of the tab 6 for the known pin 1 according to FIG. 1. This results in that the distance between the outer edges of the tabs 22 will relatively great and a relatively large number of conductors 3 on the PCB 4 can have room between the tabs. In turn this results in that the number of layers 5 of the PCB 4 can be relatively small, which makes the PCB cheap.

In the embodiments described above the pins have been thrust into holes in the PCT. It will be obvious to one skilled in the art that the invention can also be applied to pins which are soldered at the surface of a PCB.

We claim:

1. A pin attached to a printed circuit board (PCB) by soldering for connecting electrical conductors to the PCB, the pin having a first part soldered to a metal coating on the PCB, and a second part with which said electrical conductors can make contact, and where flux is used in soldering the pin, the flux wetting the surface of the pin and creeping away from the soldering location, characterized in that the pin (21,31) has a shoulder (27; 35) where the second part (26;33,34) of the pin (21, 31) projects out in the transverse direction of the pin outside the first part (24, 32) of the pin (21, 31), the pin having a sharp junction with an edge (30) between the shoulder (27, 35) and at least one of the first (24, 32) or second (26, 33) parts of the pin (21, 31), said edge (30) counteracting creep of the flux (28) along the surface of the second part (26, 33, 34) of the pin (21, 31).

2. Pin attached to a PCB by soldering as claimed in claim 1, characterized in that the second part (26, 33, 34) of the pin projects outside the first part (24, 32) of the pin around the entire periphery of the pin (21, 31).

3. Pin attached to a PCB by soldering as claimed in claim 1, characterized in that the metal coating (22, 23) includes a tube (23) passing through the PCB (4), and in that the first part (24, 32) of the pin (21, 31) is elongate, uniformly thick and projects into the tube (23).

4. Pin attached to a PCB by soldering as claimed in claim 1, characterized in that the shoulder (27, 35) is situated spaced from the metal coating (22, 23) of the PCB (4).

5. A pin attached to a PCB by soldering as claimed in claim 4, characterized in that the second part of the pin projects outside the first part of the pin around the entire periphery of the pin.

* * * * *